(12) United States Patent
Tanabe et al.

(10) Patent No.: US 11,183,417 B2
(45) Date of Patent: Nov. 23, 2021

(54) METHOD FOR MANUFACTURING LAMINATE AND METHOD FOR MANUFACTURING SUBSTRATE

(71) Applicant: SHIN-ETSU CHEMICAL CO., LTD., Tokyo (JP)

(72) Inventors: Masahito Tanabe, Annaka (JP); Michihiro Sugo, Takasaki (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 131 days.

(21) Appl. No.: 16/655,499

(22) Filed: Oct. 17, 2019

(65) Prior Publication Data

US 2020/0144093 A1    May 7, 2020

(30) Foreign Application Priority Data

Nov. 1, 2018  (JP) .............................. JP2018-206753

(51) Int. Cl.
*H01L 21/683* (2006.01)
*B32B 37/12* (2006.01)
(Continued)

(52) U.S. Cl.
CPC .......... *H01L 21/6836* (2013.01); *B32B 37/12* (2013.01); *C09J 183/04* (2013.01);
(Continued)

(58) Field of Classification Search
CPC combination set(s) only.
See application file for complete search history.

(56) References Cited

U.S. PATENT DOCUMENTS

2005/0233547 A1   10/2005   Noda et al.
2008/0268618 A1   10/2008   Yamazaki
(Continued)

FOREIGN PATENT DOCUMENTS

EP    2738797 A2    6/2014
EP    3121838 A1    1/2017
(Continued)

OTHER PUBLICATIONS

Jan. 8, 2020 Extended European Search Report issued in European Patent Application No. 190206143.0.

*Primary Examiner* — Ratisha Mehta
(74) *Attorney, Agent, or Firm* — Oliff PLC (57) ABSTRACT

A method for manufacturing a laminate including a support and a substrate having a back surface to be processed and a non-processed surface, the support and the non-processed surface being bonded via a temporary adhesive material. The method includes the steps: (a) laminating the temporary adhesive material on either or both of the support and the non-processed surface of the substrate; (b) preheating the support and the substrate before the bonding is started; and (c) bonding the support and the substrate via the temporary adhesive material. In the step (b), the substrate is heated to a temperature of 50° C. or more and 250° C. or less, while the support is heated to a temperature of 50° C. or more and 250° C. or less but different from that of the substrate. In the step (c), the bonding is started with the temperatures of the support and the substrate after the preheating being different.

18 Claims, 1 Drawing Sheet

(51) Int. Cl.
*C09J 183/04* (2006.01)
*H01L 21/02* (2006.01)
*H01L 21/304* (2006.01)
*H01L 21/768* (2006.01)

(52) U.S. Cl.
CPC ...... *H01L 21/02057* (2013.01); *H01L 21/304* (2013.01); *H01L 21/76898* (2013.01); *B32B 2457/14* (2013.01); *H01L 2221/68327* (2013.01); *H01L 2221/68372* (2013.01)

(56) References Cited

U.S. PATENT DOCUMENTS

| | | | |
|---|---|---|---|
| 2014/0106137 A1* | 4/2014 | Kondo | H01L 21/6835 |
| | | | 428/195.1 |
| 2014/0154868 A1 | 6/2014 | Sugo et al. | |
| 2017/0069521 A1* | 3/2017 | Sugo | B32B 27/26 |
| 2017/0154802 A1* | 6/2017 | Yasuda | C09J 5/00 |

FOREIGN PATENT DOCUMENTS

| | | |
|---|---|---|
| JP | 2004-064040 A | 2/2004 |
| JP | 6059631 B2 | 1/2017 |

\* cited by examiner

METHOD FOR MANUFACTURING LAMINATE AND METHOD FOR MANUFACTURING SUBSTRATE

TECHNICAL FIELD

The present invention relates to a method for manufacturing a laminate and a method for manufacturing a substrate.

BACKGROUND ART

Three-dimensional semiconductor mounting has become essential for higher density and larger capacity. The three-dimensional mounting technique is a semiconductor production technique for thinning a semiconductor chip and connecting the chip to another chip by a through silicon via (TSV) electrode to form a multilayer. This requires steps of thinning a substrate by grinding a non-circuit-forming surface (also referred to as "back surface") of the substrate on which a semiconductor circuit has been formed, followed by forming an electrode including a TSV on the back surface.

In the step of grinding the back surface of a silicon substrate, a protective tape is conventionally attached to a surface opposite to the surface to be ground to prevent the substrate from breaking during grinding. However, this tape uses an organic resin film as the base material, which has flexibility, but inadequate strength and heat resistance. Thus, this tape is not suited to the steps of forming a TSV and forming a wiring layer on the back surface.

In this context, it has been suggested a system of bonding a semiconductor substrate to a support made of silicon, glass or the like via an adhesive layer, making it possible to sufficiently withstand the steps of grinding the back surface and forming a TSV and an electrode on the back surface. The key to this system is the adhesive layer used for bonding the substrate to the support. The adhesive layer is required to have a sufficient durability to bond the substrate to the support without gaps and to withstand subsequent steps, and is also required to allow the thin substrate to be easily separated from the support finally. As described above, this adhesive layer is finally removed and is referred to as "temporary adhesive layer," and the material used for the adhesive layer is referred to as "temporary adhesive material" in this description.

As conventionally known methods for manufacturing a laminate using a temporary adhesive layer, there have been proposed techniques in which a temporary adhesive layer is formed on either or both of a substrate and a support, and the substrate and the support are optionally preheated to the same temperature in a bonding apparatus and then bonded to each other (Patent Documents 1, 2). These bonding methods have a problem when the substrate and the support are bonded via materials which are different from each other in melt viscosity at the bonding temperature.

CITATION LIST

Patent Literature

Patent Document 1: Japanese Patent Laid-Open Publication No. 2004-64040
Patent Document 2: Japanese Patent No. 6059631

SUMMARY OF INVENTION

Technical Problem

The present invention has been made in view of the above-described problems. An object of the present invention is to provide a method for manufacturing a laminate where a support and a substrate can be easily bonded via a temporary adhesive material and also easily separated from each other, the laminate has excellent resistance to thermal process such as CVD (chemical vapor deposition), and it is possible to increase the productivity of thin substrates.

Solution to Problem

To achieve the object, the present invention provides a method for manufacturing a laminate including a support and a substrate having a back surface to be processed and a non-processed surface (opposite to the back surface of the substrate), the support and the non-processed surface being bonded via a temporary adhesive material, the method comprising the steps of:

(a) laminating the temporary adhesive material on either or both of the support and the non-processed surface of the substrate;

(b) preheating the support and the substrate before the bonding is started; and (c) bonding the support and the substrate via the temporary adhesive material, wherein in the step (b), the substrate is heated to a temperature of 50° C. or more and 250° C. or less, while the support is heated to a temperature of 50° C. or more and 250° C. or less but different from that of the substrate, and in the step (c), the bonding is started with the temperatures of the support and the substrate after the preheating being different.

The inventive method for manufacturing a laminate makes it possible to easily bond and separate a support and a substrate via a temporary adhesive material and to increase the productivity of thin substrates, and enables the laminate to have excellent resistance to thermal process such as CVD (chemical vapor deposition).

In this case, in the step (c), the bonding is preferably started with the temperatures of the support and the substrate being different by 10° C. or more.

The method for manufacturing a laminate with such temperature conditions is preferable because of excellent filling characteristics for an uneven substrate.

Moreover, in the present invention, as the temporary adhesive material, it is preferable to use a temporary adhesive material which comprises at least two or more layers of:

a first temporary adhesive material layer (A) located at the substrate side; and a second temporary adhesive material layer (B) located closer to the support side than the first temporary adhesive material layer (A).

With such a temporary adhesive material, temporary adhesive material layers having different properties such as melt viscosity can be selected independently as necessary.

In this case, the temporary adhesive material preferably comprises the first temporary adhesive material layer (A) and the second temporary adhesive material layer (B) which have a melt viscosity ratio $\alpha/\beta$ of 10 or less at 25° C. and a lowest melt viscosity ratio of 100 or more at 100° C. or more and 200° C. or less.

The use of temporary adhesive materials having such melt viscosity ratios is preferable because the bonding process can be finished in a short time.

Further, in the present invention, in the step (a), the temporary adhesive material is preferably laminated such that the first temporary adhesive material layer (A) and the second temporary adhesive material layer (B) are formed adjacent to each other.

In this case, it is preferable to use the temporary adhesive material comprising the second temporary adhesive material layer (B) composed of a thermosetting resin, and a cured film of the thermosetting resin exhibits an elastic modulus of 50 MPa or more and 1 GPa or less at 25° C. measured by dynamic viscoelasticity measurement.

The second temporary adhesive material layer (B) whose cured film has such an elastic modulus is preferable because the substrate does not warp during the temporary fixation, particularly after the substrate is ground.

Furthermore, in the present invention, the second temporary adhesive material layer (B) is preferably formed from a thermosetting resin composition containing:

100 parts by mass of a siloxane bond-containing polymer having a repeating unit shown by the following general formula (1) and a weight-average molecular weight of 3,000 to 500,000; and

0.1 to 50 parts by mass of one or more crosslinkers selected from an amino condensate, a melamine resin, and a urea resin each modified with formalin or formalin-alcohol, a phenol compound having on average two or more methylol groups or alkoxy methylol groups per molecule, and an epoxy compound having on average two or more epoxy groups per molecule, wherein $R^1$ to $R^4$ may be identical or different and each represent a monovalent hydrocarbon group having 1 to 8 carbon atoms; "m" is an integer of 1 to 100; B is a positive number, and A is 0 or a positive number, provided that A+B=1; X represents a divalent organic group shown by the following general formula (2):

wherein Z represents a divalent organic group selected from any of

N is 0 or 1; $R^5$ and $R^6$ each represent an alkyl group or an alkoxy group having 1 to 4 carbon atoms and may be the same or different from each other; and "k" is any of 0, 1, and 2.

Such a second temporary adhesive material layer (B) is more excellent in heat resistance and preferable.

Further, in the present invention, the second temporary adhesive material layer (B) is preferably formed from a thermosetting resin composition containing:

100 parts by mass of a siloxane bond-containing polymer having a repeating unit shown by the following general formula (3) and a weight-average molecular weight of 3,000 to 500,000; and

0.1 to 50 parts by mass of one or more crosslinkers selected from a phenol compound having on average two or more phenol groups per molecule and an epoxy compound having on average two or more epoxy groups per molecule, wherein $R^7$ to $R^{10}$ may be identical or different and each represent a monovalent hydrocarbon group having 1 to 8 carbon atoms; "n" is an integer of 1 to 100; D is a positive number, and C is 0 or a positive number, provided that C+D=1; Y represents a divalent organic group shown by the following general formula (4):

wherein V represents a divalent organic group selected from any of

"p" represents 0 or 1; $R^{11}$ and $R^{12}$ each represent an alkyl group or an alkoxy group having 1 to 4 carbon atoms and may be the same or different from each other; and "h" is any of 0, 1, and 2.

Such a second temporary adhesive material layer (B) is further excellent in heat resistance and preferable.

Furthermore, the present invention provides a method for manufacturing a substrate, comprising the steps of:

(d) after a laminate is obtained by the above-described method for manufacturing a laminate, processing the back surface of the substrate; and thereafter, (e) removing the support and the temporary adhesive material from the laminate, and then cleaning the substrate, wherein in the step (e), the surface of the cleaned substrate where the support has been removed has a contact angle of less than 30° with water.

Such a method for manufacturing a substrate makes it possible to manufacture a substrate which facilitates the production of a thin substrate having a through electrode structure or a bump connection structure without causing a defect derived from the temporary adhesive material in the subsequent process.

Advantageous Effects of Invention

As described above, the inventive method for manufacturing a laminate makes it possible to easily manufacture a laminate with different materials particularly in melt viscosity. In this way, since materials different from each other in melt viscosity are usable, a laminate can be manufactured using various materials. Moreover, it is possible to prevent generation of defects such as void in producing a laminate, and the productivity of thin substrates can be increased greatly.

DESCRIPTION OF EMBODIMENTS

As described above, there have been demands for a temporary adhesive material which is used for substrate processing, and which facilitates temporary adhesion such that the temporary adhesive material rapidly forms on a substrate or a support and easily separates therefrom and has excellent dimensional stability and excellent substrate resistance to thermal process such as CVD, consequently increasing the productivity of thin substrates.

The present inventors have earnestly studied to accomplish the above object and consequently found that a thin substrate having a through electrode structure or a bump connection structure can be produced conveniently as follows. Specifically, in a step of preheating a support and a substrate before the bonding is started, the substrate is heated to a temperature of 50° C. or more and 250° C. or less, while the support is heated to a temperature of 50° C. or more and 250° C. or less but different from that of the substrate; in a step of bonding the support and the substrate via a temporary adhesive material, the bonding is started with the temperatures of the support and the substrate after the preheating being different. This finding has led to the completion of the present invention.

That is, the present invention is a method for manufacturing a laminate including a support and a substrate having a back surface to be processed and a non-processed surface, the support and the non-processed surface being bonded via a temporary adhesive material, the method comprising the steps of:

(a) laminating the temporary adhesive material on either or both of the support and the non-processed surface of the substrate;

(b) preheating the support and the substrate before the bonding is started; and (c) bonding the support and the substrate via the temporary adhesive material, wherein in the step (b), the substrate is heated to a temperature of 50° C. or more and 250° C. or less, while the support is heated to a temperature of 50° C. or more and 250° C. or less but different from that of the substrate, and in the step (c), the bonding is started with the temperatures of the support and the substrate after the preheating being different.

The inventive method for manufacturing a laminate as described above is capable of manufacturing a laminate without causing defects such as void at the time of bonding via different materials in melt viscosity. Thus, the present invention makes it possible to easily obtain a laminate in which a support and a non-processed surface of a substrate having a back surface to be processed are bonded via the temporary adhesive material.

Hereinafter, the present invention will be described in detail, but the present invention is not limited thereto.

[Laminate]

Figure 1:
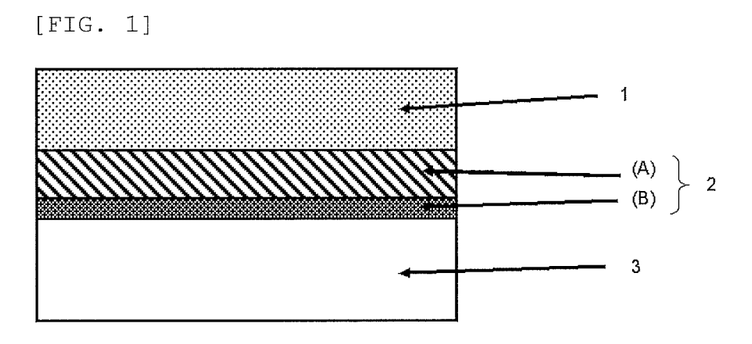
FIG. 1 is a configuration diagram showing an example of a laminate obtained by the inventive method for manufacturing a laminate.

FIG. 1 is a configuration diagram showing an example of a laminate obtained by the inventive method for manufacturing a laminate. As shown in FIG. 1, the laminate includes a substrate 1 and a support 3 bonded via a temporary adhesive material 2.

The substrate 1 is, for example, a substrate in which one of the surfaces is a circuit-forming surface, and the other surface (back surface) to be processed is a non-circuit-forming surface. The substrate to which the present invention is applicable is normally a semiconductor substrate. Examples of the semiconductor substrate include a disc-shaped wafer, a square substrate, and the like. Examples of the wafer include not only a silicon wafer, but also a germanium wafer, a gallium-arsenic wafer, a gallium-phosphorus wafer, a gallium-arsenic-aluminum wafer, and the like. The thickness of the substrate is typically, but not particularly limited to, 600 to 800 μm, more typically 625 to 775 μm.

As the support 3, which is not particularly limited, a substrate such as a silicon wafer, a glass plate, and a quartz wafer can be used. In the present invention, the temporary adhesive material is not necessarily irradiated with energy radiation through the support, and the support does not have to be light transmittable thereby.

The temporary adhesive material 2 is not particularly limited as long as it serves as an adhesive layer when the substrate is bonded to the support, is capable of bonding the substrate to the support without gaps, has a sufficient durability to withstand subsequent steps, and also enables a thin substrate to be easily separated from the support at the end. Moreover, the temporary adhesive material 2 used in the present invention may be a monolayer, or may be constituted of multiple layers. Hereinafter, each of the layers constituting such a temporary adhesive material is also referred to as temporary adhesive material layer. The temporary adhesive material 2 used in the inventive method for manufacturing a laminate is preferably a temporary adhesive material including at least two or more layers of: a first temporary adhesive material layer (A) located at the substrate side; and a second temporary adhesive material layer (B) located closer to the support side than the first temporary adhesive material layer (A).

FIG. 1 shows the laminate in which the temporary adhesive material 2 consists of the first temporary adhesive material layer (A) and the second temporary adhesive material layer (B).

Hereinbelow, a method for manufacturing the laminate shown in FIG. 1 will be mainly described, but the present invention is not limited thereto. Moreover, as the temporary adhesive material used in the inventive method for manufacturing a laminate, the temporary adhesive material having the first temporary adhesive material layer (A) and the second temporary adhesive material layer (B) will be mainly described, but the temporary adhesive material may include only one of (A) and (B), or may include a layer other than (A) and (B).

[Method for Manufacturing Laminate]

The inventive method for manufacturing a laminate is a method for manufacturing a laminate including a support and a substrate (substrate having a semiconductor circuit etc.) having a back surface to be processed and a non-processed surface (not the back surface of the substrate, but a surface where the semiconductor circuit is formed), the support and the non-processed surface being bonded via a temporary adhesive material. The method includes the following steps.

Step (a): a step of laminating the temporary adhesive material on either or both of the support and the non-processed surface of the substrate,
Step (b): a step of preheating the support and the substrate before the bonding is started, and
Step (c): a step of bonding the support and the substrate via the temporary adhesive material.

In the present invention, in the step (b), the substrate is heated to a temperature of 50° C. or more and 250° C. or less, while the support is heated to a temperature of 50° C. or more and 250° C. or less but different from that of the substrate; in the step (c), the bonding is started with the temperature of the preheated support and the temperature of the preheated substrate being different. The heating time is not particularly limited, but is preferably about 30 seconds to 5 minutes. The temporary adhesive material is heated together with the substrate and/or the support on which the temporary adhesive material is stacked.

Note that, in the present invention, "before the bonding is started" and similar phrases mean a state after the support and the substrate are set at predetermined positions inside chambers or the like in a bonding apparatus until the support and the substrate are brought into contact with each other.

Figure 2:
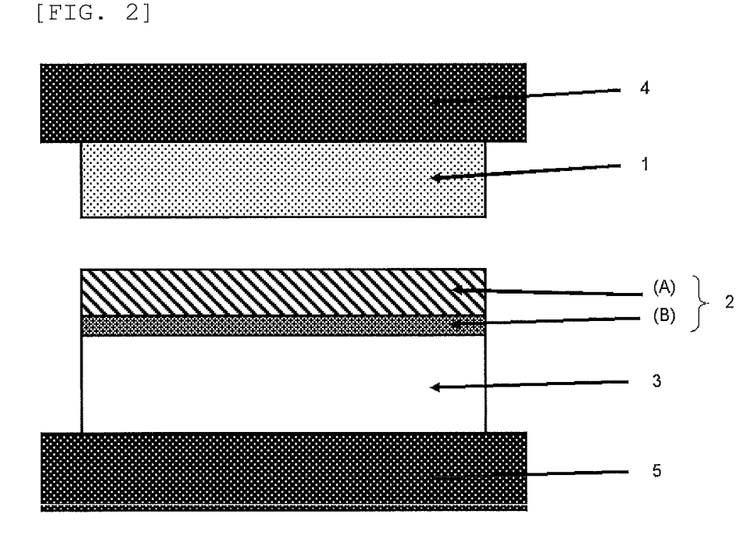
FIG. 2 is a configuration diagram showing an example of heating performed on a support and a substrate before bonding in the present invention.

FIG. 2 shows an example of heating performed on the support and the substrate before the bonding in the present invention. As shown in FIG. 2, the substrate 1 is placed on a substrate-placement plate 4 disposed in a bonding apparatus, and the support 3 on which the temporary adhesive material 2 is laminated in advance is placed on a support-placement plate 5. The plates 4, 5 are provided with certain heating means with which the substrate side and the support side can be individually heated to certain temperatures, respectively.

In the inventive method for manufacturing a laminate, in the step (b), the substrate temperature is increased by the preheating to 50° C. or more and 250° C. or less, and the support temperature is increased by another preheating to 50° C. or more and 250° C. or less such that bonding the two is started in the step (c) with the substrate temperature and the support temperature being different.

Additionally, the temperature difference between the substrate temperature and the support temperature can be set appropriately, but the bonding is preferably started with the temperatures being different by 10° C. or more. The upper limit of the temperature difference is suitably 100° C. or less. The lower limit is not particularly limited, but the difference is further preferably set at 20° C. or more. Furthermore, the substrate temperature is desirably higher than the support temperature.

Such bonding method can sufficiently suppress defects such as void generated by the bonding step.

—Step (a)—

The step (a) is a step of laminating the temporary adhesive material on either or both of the support and the non-processed surface (not the back surface) of the substrate. Hereinbelow, the step of laminating the temporary adhesive material on the support will be mainly described, but the temporary adhesive material can also be laminated on the substrate side.

The temporary adhesive material can be laminated (formed) on either or both of the support and the non-processed surface of the substrate (hereinafter, also referred to as "support etc."), for example, by subjecting a resin composition solution to known methods such as spin coating or roll coating. In this case, after spin coating, the solvent is first volatilized at a temperature of 80 to 200° C., preferably 100 to 180° C., depending on the volatilization condition of the solvent, and the resultant is then used.

In the case where the temporary adhesive material including two or more layers is laminated, these layers may be formed respectively on the support and the substrate, or the multiple layers may be formed only on the support or only on the substrate. In the case where such multiple layers are formed, after the first layer is formed, the second layer can be further formed adjacent to the first layer by the same method again. Each layer can be formed by the aforementioned methods.

Alternatively, the temporary adhesive material formed as a film on a release backing in advance may be stacked by lamination, that is, the temporary adhesive material may be laminated on the support etc.

As the apparatus for laminating the temporary adhesive material onto the support etc., commercially available apparatuses can be used. In the case of forming the temporary adhesive material by spin coating, a coater, for example, XBS300 manufactured by SUSS MicroTec AG, and so forth can be used. In the case of stacking by lamination, examples of the apparatus include vacuum laminators such as TEAM-300 manufactured by Takatori Corporation.

—Step (b)—

The step (b) is a step of preheating the support and the substrate before the bonding is started. This step can be performed in the bonding apparatus. In this case, heating means are incorporated in the bonding apparatus. The heaters are incorporated in the plates (chambers) where the support and the substrate are to be placed. Note that particularly no problem occur as long as the heaters are known heating devices. The substrate is heated to a temperature of 50° C. or more and 250° C. or less, while the support is heated to a temperature of 50° C. or more and 250° C. or less but different from that of the substrate.

The two are heated at different temperatures by preferably 10° C. or more, more preferably 20° C. or more.

—Step (c)—

The step (c) is a step of bonding the support and the substrate via the temporary adhesive material. The support and the substrate are preferably attached and bonded under reduced pressure. For example, under the heating temperature condition of the step (b), the substrate is uniformly pressed under vacuum (under reduced pressure; at a pressure of 1 Pa or less) for bonding, so that a laminate is formed in which the support and the substrate are bonded via the temporary adhesive material. In this event, the time for contact bonding is 10 seconds to 10 minutes, preferably 30 seconds to 5 minutes.

Figure 3:
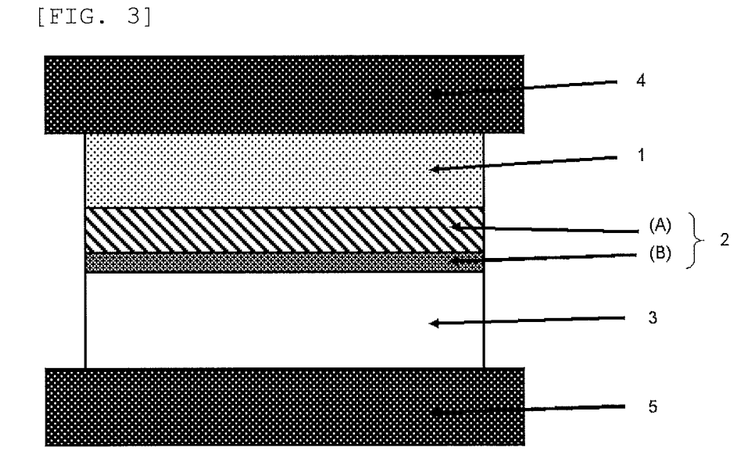
FIG. 3 is a configuration diagram showing an example of the laminate immediately after the bonding in the present invention.

For example, as shown in FIG. 2, the substrate 1 is placed on the substrate-placement plate 4, and the support 3 on which the temporary adhesive material 2 is laminated is placed on the support-placement plate 5. Then, the substrate side and the support side are heated to different predetermined temperatures. In this state, as shown in FIG. 3, the substrate 1 is uniformly pressed and thus bonded under reduced pressure onto the surface of the support 3 where the temporary adhesive material 2 is laminated.

When a wafer is used, examples of the substrate-bonding apparatus include commercially available wafer-bonding apparatuses, for example, EVG520IS and 850TB manufactured by EVG Group, XBS300 manufactured by SUSS MicroTec AG, and the like.

[Temporary Adhesive Material Layer]

The temporary adhesive material used in the present invention may be a monolayer, or may be constituted of multiple layers. As the temporary adhesive material, it is preferable to use a temporary adhesive material having at least two or more layers of: the first temporary adhesive material layer (A) located at the substrate side; and the second temporary adhesive material layer (B) located closer to the support side than the first temporary adhesive material layer (A). Furthermore, the temporary adhesive material can have a third temporary adhesive material layer (C) and another functional layer, too.

In this case, it is preferable to use the temporary adhesive material including the first temporary adhesive material layer (A) and the second temporary adhesive material layer (B) which have a melt viscosity ratio $\alpha/\beta$ of 10 or less at 25° C. and a lowest melt viscosity ratio of 100 or more at 100° C. or more and 200° C. or less. The melt viscosity ratio $\alpha/\beta$ at 25° C. is more preferably 0.05 to 5, further preferably 0.05 to 1. The lowest melt viscosity ratio at 100° C. or more and 200° C. or less is more preferably 100 to 1000, further preferably 120 to 500.

The temporary adhesive materials with such melt viscosity ratios are preferable because the bonding process can be finished in a short time. Moreover, the temporary adhesive materials with such melt viscosity ratios are preferable because the temporary adhesive materials do not adhere to the substrate periphery during the bonding.

Hereinafter, the temporary adhesive material (temporary adhesive material layers) used in the inventive method for manufacturing a laminate will be specifically described. However, the usable temporary adhesive material is not limited thereto.

—First Temporary Adhesive Material Layer (A)—

Of the temporary adhesive material layers constituting the temporary adhesive material, the first temporary adhesive material layer (A) is located at the substrate side. The material is not particularly limited. Nevertheless, in view of the applicability to a stepped substrate and so forth, a thermoplastic resin having favorable filling characteristics is suitably used. Hereinbelow, detailed description will be given for the case where the first temporary adhesive material layer (A) is formed from a thermoplastic resin. However, the temporary adhesive material used in the inventive method for manufacturing a laminate is not limited thereto.

The first temporary adhesive material layer (A) is preferably a thermoplastic resin containing no organopolysiloxane and having a glass transition temperature of approximately −80 to 150° C. Examples of the thermoplastic resin include olefin-based thermoplastic elastomers, polybutadiene-based thermoplastic elastomers, styrene-based thermoplastic elastomers, styrene/butadiene-based thermoplastic elastomers, styrene/polyolefin-based thermoplastic elastomers, and the like. Particularly, hydrogenated polystyrene-based elastomers excellent in heat resistance are preferable.

As such thermoplastic resins, commercially available products can be used. Specific examples thereof include Tuftec (Asahi Kasei Chemicals Corporation), ESPOLEX SB series (Sumitomo Chemical Co., Ltd.), RABALON (Mitsubishi Chemical Corporation), SEPTON (Kuraray Co., Ltd.), DYNARON (JSR), and the like. Moreover, other examples include cycloolefin polymers represented by ZEONEX (ZEON Corporation) and cyclic olefin copolymers represented by TOPAS (Nippon Polyplastics Co., Ltd.).

As described above, the thermoplastic resin for the first temporary adhesive material layer (A) is preferably a thermoplastic elastomer. Additionally, two or more types of resins may be used in combination.

After a thin substrate is manufactured, such materials can further facilitate the separation of the temporary adhesive material from the substrate and cleaning of the substrate. Thus, fragile thin substrate can be handled more easily.

The thermoplastic resin layer composition may be dissolved in a solvent to prepare an (A) layer solution used for forming the temporary adhesive material layer. Examples of the solvent include hydrocarbon-based solvents, preferably nonane, p-menthane, pinene, isooctane, mesitylene, and the like. In view of coating properties, nonane, p-menthane, isooctane, and mesitylene are more preferable. Further, the solution may be filtered as necessary, and then preferably applied onto a release backing by using a forward roll coater, a reverse roll coater, a comma coater, a die coater, a lip coater, a gravure coater, a dip coater, an air knife coater, a capillary coater, a raising & rising (R&R) coater, a blade coater, a bar coater, an applicator, an extruder, or the like. Subsequently, the release backing coated with the (A) layer solution is subjected to in-line solvent removal to form the first temporary adhesive material layer (A).

In this event, the thickness of the layer to be formed is not limited, but is preferably 0.5 to 80 μm, further preferably 0.5 to 50 μm. Moreover, to this thermoplastic resin, an antioxidant can be added to improve the heat resistance, and a surfactant can be added to improve the coating properties. As a specific example of the antioxidant, di-t-butylphenol or the like is suitably used. As an example of the surfactant, a fluorosilicone-based surfactant X-70-1102 (manufactured by Shin-Etsu Chemical Co., Ltd.) or the like is suitably used.

—Second Temporary Adhesive Material Layer (B)—

Of the temporary adhesive material layers constituting the temporary adhesive material, the second temporary adhesive material layer (B) is a temporary adhesive material layer located closer to the support side than the above-described first temporary adhesive material layer (A). The material is not particularly limited, but is preferably a thermosetting resin, more preferably a silicone-based resin. The second temporary adhesive material layer (B) is particularly preferably formed from a thermosetting resin composition mainly containing a thermosetting siloxane-modified polymer (siloxane bond-containing polymer) having a repeating unit(s) shown by the following general formula(e) (1) and/or (3). Further, the resin composition may contain a crosslinker and a curing catalyst as necessary.

As the second temporary adhesive material layer (B), it is possible to use both of the polymer shown by the following general formula (1) and the polymer shown by the following general formula (3). In that case, the ratio (mass ratio) thereof is preferably (1):(3)=0.1:99.9 to 99.9:0.1, more preferably (1):(3)=1:99 to 99:1.

<Polymer of General Formula (1) (Phenolic Siloxane Polymer)>

Siloxane bond-containing polymer having a repeating unit shown by the following general formula (1) and a weight-average molecular weight of 3,000 to 500,000, preferably 10,000 to 100,000, in terms of polystyrene determined by gel permeation chromatography (GPC).

In the formula, $R^1$ to $R^4$ may be identical or different and each represent a monovalent hydrocarbon group having 1 to 8 carbon atoms. "m" is an integer of 1 to 100. B is a positive number. A is 0 or a positive number. X represents a divalent organic group shown by the following general formula (2). A+B=1. Preferably, A is 0 to 0.9, and B is 0.1 to 1. When A is larger than 0, A is preferably 0.1 to 0.7, and B is preferably 0.3 to 0.9.

In the formula, Z represents a divalent organic group selected from any of

N is 0 or 1. $R^5$ and $R^6$ each represent an alkyl group or an alkoxy group having 1 to 4 carbon atoms and may be the same or different from each other. "k" is any of 0, 1, and 2.

In this case, specific examples of $R^1$ to $R^4$ include a methyl group, an ethyl group, a phenyl group, and the like. "m" is an integer of 1 to 100, preferably 3 to 60, more preferably 8 to 40. B/A is preferably larger than 0 but smaller than 20, particularly preferably from 0.5 to 5.

<Polymer of General Formula (3) (Epoxy-Modified Siloxane Polymer)>

Siloxane bond-containing polymer having a repeating unit shown by the following general formula (3) and a weight-average molecular weight of 3,000 to 500,000 in terms of polystyrene determined by GPC.

In the formula, $R^7$ to $R^{10}$ may be identical or different and each represent a monovalent hydrocarbon group having 1 to 8 carbon atoms. "n" is an integer of 1 to 100. D is a positive number. C is 0 or a positive number. Y represents a divalent organic group shown by the following general formula (4). C+D=1. Preferably, C is 0 to 0.9, and D is 0.1 to 1. When C is larger than 0, C is preferably 0.1 to 0.7, and D is preferably 0.3 to 0.9.

In the formula, V represents a divalent organic group selected from any of

"p" represents 0 or 1. $R^{11}$ and $R^{12}$ each represent an alkyl group or an alkoxy group having 1 to 4 carbon atoms and may be the same or different from each other. "h" is any of 0, 1, and 2.

In this case, specific examples of $R^7$ to $R^{10}$ are the same as those exemplified as $R^1$ to $R^4$ in the general formula (1). "n" is an integer of 1 to 100, preferably 3 to 60, more preferably 8 to 40. D/C is preferably larger than 0 but smaller than 20, particularly preferably from 0.5 to 5.

<Crosslinker>

The thermosetting composition mainly containing the thermosetting siloxane-modified polymer of the general formula(e) (1) and/or (3) may contain one or more crosslinkers for the heat curing. In the case of the phenolic siloxane polymer of the general formula (1), the crosslinker is selected from: an amino condensate, a melamine resin, and a urea resin each of which is modified with formalin or formalin-alcohol; a phenol compound having on average two or more methylol groups or alkoxy methylol groups per molecule; and an epoxy compound having on average two or more epoxy groups per molecule.

Here, examples of the amino condensate, melamine resin, and urea resin each modified with formalin or formalin-alcohol include the following. For example, the melamine resin (condensate) modified with formalin or formalin-alcohol can be obtained by addition condensation polymerization of a modified melamine monomer (e.g., trimethoxymethyl monomethylol melamine), or a polymer thereof (e.g., oligomer such as dimer and trimer) with formaldehyde until a desired molecular weight is achieved according to a known method. Incidentally, these can be used alone or in mixture of two or more.

Moreover, the urea resin (condensate) modified with formalin or formalin-alcohol can be prepared, for example, by modifying a urea condensate having a desired molecular weight with formalin into a methylol form, and optionally further modifying the resultant with an alcohol into an alkoxy form, according to a known method. Specific examples of the urea resin modified with formalin or formalin-alcohol include methoxymethylated urea condensate, ethoxymethylated urea condensate, propoxymethylated urea condensate, and the like. Incidentally, these can be used alone or in mixture of two or more.

Further, examples of the phenol compound having on average two or more methylol groups or alkoxy methylol groups per molecule include (2-hydroxy-5-methyl)-1,3-benzenedimethanol, 2,2',6,6'-tetramethoxymethylbisphenol A, and the like. Incidentally, these phenol compounds can be used alone or in mixture of two or more.

Meanwhile, in the case of the epoxy-modified siloxane polymer (siloxane bond-containing polymer) of the general formula (3), the composition may contain one or more crosslinkers selected from a phenol compound having on average two or more phenol groups per molecule and an epoxy compound having on average two or more epoxy groups per molecule.

Here, the epoxy compound having a polyfunctional epoxy group used with the polymer(s) of the general formula(e) (1) and/or (3) is not particularly limited. The composition may contain a bi-functional, tri-functional, or tetra-functional or more of polyfunctional epoxy resin, for example, EOCN-1020, EOCN-102S, XD-1000, NC-2000-L, EPPN-201, GAN, and NC6000 manufactured by Nippon Kayaku Co., Ltd., or crosslinkers shown by the following formulae:

In the case of the epoxy-modified siloxane polymer of the general formula (3), specific examples of the phenol compound having on average two or more phenol groups per molecule as the crosslinker include m- or p-cresol novolac resins such as EP-6030G manufactured by Asahi Organic Chemicals Industry Co., Ltd.; tri-functional phenol compounds such as Tris-P-PA manufactured by Honshu Chemical Industry Co., Ltd.; tetrafunctional phenol compounds such as TEP-TPA manufactured by Asahi Organic Chemicals Industry Co., Ltd.; and the like.

The crosslinker can be blended in an amount of 0.1 to 50 parts by mass, preferably 0.1 to 30 parts by mass, further preferably 1 to 20 parts by mass, based on 100 parts by mass of the thermosetting polymer (siloxane bond-containing polymer) of the general formula (1) or (3). Two or more types of crosslinkers may be blended as mixture.

Additionally, the composition may contain 10 parts by mass or less of a curing catalyst such as an acid anhydride based on 100 parts by mass of the thermosetting polymer.

[Other Components]

The thermosetting resin layer composition may be dissolved in a solvent to prepare a (B) layer solution used for forming the temporary adhesive material layer. Examples of the solvent include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone; and the like. One of these may be used alone, or two or more thereof may be used in combination. Further, the solution may be filtered as necessary, and then applied onto the layer (A) formed on the release backing by the same method as for the layer (A), followed by solvent removal to form the layer (B).

Incidentally, to further improve the heat resistance, a known antioxidant or a filler such as silica may be added in an amount of 50 parts by mass or less based on 100 parts by mass of the thermosetting polymer. Furthermore, to improve the coating uniformity, a surfactant may be added.

Specific examples of the antioxidant that can be added to the second temporary adhesive material layer (B) include hindered phenol compounds such as tetrakis [methylene-(3,5-di-t-butyl-4-hydroxyhydrocinnamate)]methane (product name: Adekastab AO-60).

In this event, the thickness of the layer to be formed is not particularly limited, but is preferably 5 to 150 μm, further preferably 10 to 120 μm. When the thickness is 5 μm or more, it is possible to sufficiently withstand the grinding step for thinning the substrate. When the thickness is 150 μm or less, the resin is prevented from deforming in the heat treatment process such as TSV formation process and can preferably withstand the practical use.

—Third Temporary Adhesive Material Layer (C)—

The temporary adhesive material used in the inventive method for manufacturing a laminate may further has a third temporary adhesive material layer as necessary. The third temporary adhesive material layer to be used is particularly preferably a composition (thermosetting siloxane polymer composition) containing the following components (c1), (c2), and (c3).

(c1) an organopolysiloxane having an alkenyl group in the molecule: 100 parts by mass, (c2) an organohydrogenpolysiloxane containing two or more hydrogen atoms respectively bonded to silicon atoms (Si—H groups) per molecule: the mole ratio of the Si—H groups in the component (c2) to the alkenyl group in the component (c1) is 0.3 to 15, and

(c3) a platinum-based catalyst: the amount as the effective component (in terms of mass) is more than 0 parts by mass and 0.5 parts by mass or less.

Hereinafter, each component will be described.

<Component (c1)>

The component (c1) is an organopolysiloxane having an alkenyl group in the molecule. The component (c1) is preferably a linear or branched organopolysiloxane containing 0.3 to 10 mol % of alkenyl groups based on the molar amount of Si in one molecule (mole of alkenyl group/mole of Si). The component (c1) is particularly preferably an organopolysiloxane containing 0.6 to 9 mol % of alkenyl groups based on the molar amount of Si.

Specific examples of such organopolysiloxane include compounds shown by the following formulae (5) and (6), $$R^{13}{}_{(3-a)}X^1{}_a SiO\text{—}(R^{13}X^1SiO)_l\text{—}(R^{13}{}_2SiO)_r\text{—}SiR^{13}{}_{(3-a)}X^1{}_a \quad (5)$$

$$R^{13}{}_2(HO)SiO\text{—}(R^{13}X^1SiO)_{l+2}\text{—}(R^{13}{}_2SiO)_r\text{—}SiR^{13}{}_2(OH) \quad (6)$$

where each $R^{13}$ independently represents a monovalent hydrocarbon group having no aliphatic unsaturated bond, each $X^1$ independently represents a monovalent organic group containing an alkenyl group, and "a" is an integer of 0 to 3. In the formula (5), 2a+1 is such a number that the content of alkenyl group per molecule is 0.3 to 10 mol %. In the formula (6), l+2 is such a number that the content of alkenyl group per molecule is 0.3 to 10 mol %. "l" is 0 or a positive number of 500 or less, and "r" is a positive number of 1 to 10,000.

In the formulae, $R^{13}$ is preferably a monovalent hydrocarbon group having 1 to 10 carbon atoms and no aliphatic unsaturated bond. Examples thereof include alkyl groups such as a methyl group, an ethyl group, a propyl group, and a butyl group; cycloalkyl groups such as a cyclohexyl group; aryl groups such as a phenyl group and a tolyl group; and the like. Particularly, alkyl groups such as a methyl group and a phenyl group are preferable.

The monovalent organic group containing an alkenyl group of $X^1$ is preferably an organic group having 2 to 10 carbon atoms. Examples thereof include alkenyl groups such as a vinyl group, an allyl group, a hexenyl group, and an octenyl group; (meth)acryloylalkyl groups such as an acryloylpropyl group, an acryloylmethyl group, and a methacryloylpropyl group; (meth)acryloxyalkyl groups such as an acryloxypropyl group, an acryloxymethyl group, a methacryloxypropyl group, and a methacryloxymethyl group; and alkenyl group-containing monovalent hydrocarbon groups such as a cyclohexenylethyl group and a vinyloxypropyl group. In particular, a vinyl group is industrially preferable.

In the general formula (5), "a" is an integer of 0 to 3, preferably 1 to 3 because it allows terminals of the molecular chain to be blocked with the alkenyl groups to complete the reaction within a short time by the alkenyl groups with good reactivity at the terminal of the molecular chain, and further preferably a=1 industrially in view of the cost. This alkenyl group-containing organopolysiloxane is preferably in an oil state or a crude rubber state. The alkenyl group-containing organopolysiloxane may be linear or branched. The component (c1) may be used in combination of two or more kinds.

It is to be noted that the component (c1) preferably has a number average molecular weight (Mn) of 100000 to 500000 determined by GPC.

<Component (c2)>

The component (c2) is a crosslinker and an organohydrogenpolysiloxane containing two or more hydrogen atoms respectively bonded to silicon atoms (Si—H groups) per molecule. The component (c2) has at least 2, preferably 2 or more and 100 or less, further preferably 3 or more and 50 or less, hydrogen atoms bonded to silicon atoms (SiH groups) per molecule. The component (c2) may be linear, branched, or cyclic.

The viscosity at 25° C. of the organohydrogenpolysiloxane of the component (c2) is preferably 1 to 5,000 mPa·s, more preferably 5 to 500 mPa·s. The organohydrogenpolysiloxane may be a mixture of two or more kinds. Incidentally, the viscosity is measured with a rotational viscometer.

The component (c2) is preferably blended such that the mole ratio of the Si—H group in the component (c2) to the alkenyl group in the component (c1) (Si—H group/alkenyl group) is in a range of 0.3 to 15, preferably 0.3 to 10, particularly preferably 1 to 8. The mole ratio of 0.3 or more between the SiH group and the alkenyl group is preferable because it prevents risks of lowering the crosslinking density and causing an issue of inability to cure the adhesive layer. The mole ratio of 15 or less prevents excess increase of the crosslinking density and gives sufficient adhesion and tackiness.

<Component (c3)>

The component (c3) is a platinum-based catalyst (i.e., platinum group metal catalyst). Examples thereof include chloroplatinic acid, a solution of chloroplatinic acid in alcohol, a reaction product of chloroplatinic acid with alcohol, a reaction product of chloroplatinic acid with an olefin compound, a reaction product of chloroplatinic acid with a vinyl group-containing siloxane, and the like.

The component (c3) is added in an effective amount, which is generally 1 to 5,000 ppm, preferably 5 to 2,000 ppm, in terms of the mass of platinum with respect to the total of (c1) and (c2). The amount of 1 ppm or more prevents the composition from lowering the curability, lowering the crosslinking density, and lowering the holding force. The amount of 5,000 ppm or less makes it possible to prolong the available time of the treatment solution.

The thermosetting siloxane polymer composition may be dissolved in a solvent to prepare a (C) layer solution used for forming the temporary adhesive material layer. Examples of the solvent suitably used include hydrocarbon-based solvents such as pentane, hexane, cyclohexane, isooctane, nonane, decane, p-menthane, pinene, isododecane, and limonene; and volatile and low-molecular weight siloxanes such as hexamethyldisiloxane and octamethyltrisiloxane. One of these may be used alone, or two or more thereof may be used in combination. To this thermosetting siloxane polymer composition, a known antioxidant can be added to improve the heat resistance. Further, the solution may be filtered as necessary. Subsequently, the layer (C) is formed on the layer (B) by the same method as for the layers (A) and (B). Alternatively, the temporary adhesive material having the layer (C) can be formed by: applying the solution onto a protective film, removing the solvent, and bonding the resultant onto the layer (B).

In this event, the thickness of the layer to be formed is preferably 0.1 to 30 μm, particularly preferably 1.0 to 15 μm. When the thickness is 0.1 μm or more, the separation from the substrate or the support is further facilitated. When the thickness is 30 μm or less, it is possible to sufficiently withstand the grinding step for forming a thin wafer. Incidentally, to this thermosetting siloxane polymer layer (C), a filler such as silica may be added in an amount of 50 parts by mass or less based on 100 parts by mass of the whole mixture of the components (c1), (c2), and (c3) of the thermosetting siloxane polymer in order to further improve the heat resistance.

This layer (C) may serve as a middle layer between the layer (A) and the layer (B). Alternatively, the layer (A), the layer (B), and the layer (C) may be provided in this order from the substrate side.

[Method for Manufacturing Substrate]

After the laminate resulting from the above described steps is further subjected to CVD processing and polishing and grinding processings, the substrate is separated from the support, so that a thin wafer can be obtained.

Note that a preferable thickness of the thin wafer to be obtained is typically 5 to 300 μm, more typically 10 to 100 μm.

Specifically, the present invention also provides a method for manufacturing a substrate. The method includes the steps of:

(d) after a laminate is obtained by the above-described method for manufacturing a laminate, processing the back surface of the substrate;

subsequently, a separation step such as solution separation or mechanical separation; and thereafter, (e) removing the support and the temporary adhesive material from the laminate, and then cleaning the substrate. In the step (e), the surface of the cleaned substrate where the support has been removed has a contact angle of less than 30° with water. As the cleaning fluid used here, a cleaning fluid containing a usual organic solvent can be used.

The step (d) of processing the back surface of the substrate is not particularly limited, but includes steps of CVD processing, polishing and grinding processings, and so forth. In the step (e), the method of removing the support and the temporary adhesive material from the laminate and the method of cleaning the substrate are not particularly limited, and known methods can be employed. An example of the method of removing the support and the temporary adhesive material includes a method of separating these from the substrate for removal. An example of the method of cleaning the substrate includes a method in which the substrate is sprayed with a cleaning solvent capable of dissolving the remaining temporary adhesive material etc. and then with a certain solvent for rinsing.

To measure the contact angle of the cleaned substrate with water, a known measurement method can be employed. For example, after cleaning test, the water contact angle of the substrate can be measured using a contact angle meter DM-301 manufactured by Kyowa Interface Science Co., Ltd.

The method for manufacturing a substrate as described above makes it possible to manufacture a substrate which facilitates the production of a thin substrate having a through electrode structure or a bump connection structure without causing a defect derived from the temporary adhesive material in the subsequent process.

EXAMPLE

Hereinafter, the present invention will be more specifically described by showing Examples and Comparative Example. However, the present invention is not limited to these Examples. In the following examples, part means part by mass, Me represents a methyl group, and Vi represents a vinyl group.

[Resin Solution Preparation Example 1]

Into 176 g of isononane, 24 g of SEPTON 4033 (styrene content: 30%, manufactured by Kuraray Co., Ltd.), which is a thermoplastic resin of hydrogenated styrene-isoprene-butadiene copolymer, was dissolved to give a 12 mass % solution of hydrogenated styrene-isoprene-butadiene copolymer in isononane. The obtained solution was filtered through a 0.2-μm membrane filter to give a thermoplastic resin solution in isononane (A-1).

[Resin Solution Preparation Example 2]

Into 176 g of isononane, 30 g of SEPTON 4044 (styrene content: 32%, manufactured by Kuraray Co., Ltd.), which is a thermoplastic resin of hydrogenated styrene-isoprene-butadiene copolymer, was dissolved to give a 12 mass % solution of hydrogenated styrene-isoprene-butadiene copolymer in isononane. The obtained solution was filtered through a 0.2-μm membrane filter to give a thermoplastic resin solution in isononane (A-2).

[Resin Solution Preparation Example 3]

In a flask equipped with a stirrer, a thermometer, a nitrogen purge system, and a reflux condenser, 43.1 g of 9,9'-bis(3-allyl-4-hydroxyphenyl)fluorene (M-1), 29.5 g of organohydrogensiloxane having the average structural formula (M-3), 135 g of toluene, and 0.04 g of chloroplatinic acid were introduced, and the mixture was heated to 80° C. Then, 17.5 g of 1,4-bis(dimethylsilyl)benzene (M-5) was added dropwise into the flask over 1 hour. At this time, the temperature inside the flask was increased to 85° C. After completion of dropwise addition, the mixture was aged at 80° C. for 2 hours, toluene was then distilled off, and 80 g of cyclohexanone was added to obtain a resin solution containing cyclohexanone as a solvent with a concentration of the resin solid of 50 mass %. When the molecular weight of the resin in the solution was measured by GPC, the weight-average molecular weight was 45,000 in terms of polystyrene. Then, 50 g of the resin solution was mixed with 7.5 g of an epoxy crosslinker EOCN-1020 (manufactured by Nippon Kayaku Co., Ltd.) as a crosslinker, 0.2 g of BSDM (bis(tert-butylsulfonyl)diazomethane) manufactured by Wako Pure Chemical Industries Ltd. as a curing catalyst, and 0.1 g of tetrakis [methylene-(3,5-di-t-butyl-4-hydroxyhydrocinnamate)]methane (product name: Adekastab AO-60) as an antioxidant. The obtained solution was filtered through a 1-μm membrane filter to give a resin solution (B-1). The resin was cured to form a cured film which had an elastic modulus of 300 MPa at 25° C. which was by dynamic viscoelasticity measurement.

[Resin Solution Preparation Example 4]

In a 5-L flask equipped with a stirrer, a thermometer, a nitrogen purge system, and a reflux condenser, 84.1 g of an epoxy compound (M-2) was dissolved in 600 g of toluene. Then, 294.6 g of compound (M-3) and 25.5 g of compound (M-4) were added, and the mixture was heated to 60° C. Thereafter, 1 g of a carbon-supported platinum catalyst (5 mass %) was added thereto. After confirming that the internal reaction temperature was increased to 65 to 67° C., the mixture was further heated to 90° C. and aged for 3 hours. Then, the mixture was cooled to room temperature, and 600 g of methyl isobutyl ketone (MIBK) was added thereto. This reaction solution was filtered under pressure through a filter to remove the platinum catalyst. The solvent in the resin solution was distilled off under reduced pressure, and 270 g of propylene glycol monomethyl ether acetate (PGMEA) was added thereto to obtain a resin solution containing PGMEA as a solvent with a concentration of the solid component of 60 mass %. When the molecular weight of the resin in the resin solution was measured by GPC, the weight-average molecular weight was 28,000 in terms of polystyrene. Then, 100 g of this resin solution was mixed with 9 g of a tetra-functional phenol compound TEP-TPA (manufactured by Asahi Organic Chemicals Industry Co., Ltd.) and 0.2 g of tetrahydrophthalic anhydride (RIKACID HH-A manufactured by New Japan Chemical Co., Ltd.). The obtained solution was filtered through a 1-μm membrane filter to give a resin solution (B-2). The resin was cured to form a cured film which had an elastic modulus of 500 MPa at 25° C. which was by dynamic viscoelasticity measurement.

(M-1)

(M-2)

(M-3)

(M-4)

(M-5)

[Resin Solution Preparation Example 5]

To a solution containing 400 parts of isododecane and 100 parts of polydimethylsiloxane with a number average molecular weight (Mn) of 50,000 determined by GPC and having 3 mol % of vinyl groups at both terminals and the side chain, with the terminals of the molecule being blocked with SiMe$_2$Vi groups, 10 parts of organohydrogenpolysiloxane shown by the following formula (M-7) was added (in 2 moles relative to the alkenyl groups) and mixed. Additionally, a platinum catalyst CAT-PL-5 (manufactured by Shin-Etsu Chemical Co., Ltd.) was added thereto in an amount of 0.05 parts based on 100 parts of the polydimethylsiloxane. The resultant was filtered through a 0.2-μm membrane filter to give a thermosetting siloxane polymer solution (C-1).

(M-7)

[Resin Solution Preparation Example 6]

To a solution containing 400 parts of isododecane and 100 parts of polydimethylsiloxane with a number average molecular weight (Mn) of 50,000 determined by GPC and having 3 mol % of vinyl groups at both terminals and the side chain, with the terminals of the molecule being blocked with $SiMe_2Vi$ groups, 5 parts of organohydrogenpolysiloxane shown by the following formula (M-6) was added (in 2 moles relative to the alkenyl groups) and mixed. Additionally, a platinum catalyst CAT-PL-5 (manufactured by Shin-Etsu Chemical Co., Ltd.) was added thereto in an amount of 0.05 parts based on 100 parts of the polydimethylsiloxane. The resultant was filtered through a 0.2-μm membrane filter to give a thermosetting siloxane polymer solution (C-2).

(M-6)

Example 1

The thermoplastic resin solution (A-1) was applied onto a polyethylene terephthalate (PET) film (thickness: 38 μm), which served as a release backing, at a coating rate of 0.4 m/min by using a comma coater as a film coater, and then dried to produce (A-1) layer as a first temporary adhesive material layer. Subsequently, the resin solution (B-1) was applied onto the (A-1) layer, which had been formed on the polyethylene terephthalate (PET) film, at a coating rate of 0.4 m/min by using a comma coater as a film coater, and dried to produce (B-1) layer as a second temporary adhesive material layer. Further, the thermosetting siloxane polymer solution (C-1) was applied onto the (B-1) layer on the (A-1) layer, which had been formed on the polyethylene terephthalate (PET) film, at a coating rate of 0.4 m/min by using a comma coater as a film coater, and dried to produce (C-1) layer as a third temporary adhesive material layer. Then, to the surface of the produced film, a polyethylene (PE) film (thickness: 100 μm) was stuck as a protective film at a pressure of 1 MPa. This was rolled-up around a plastic tube at a rate of 0.4 m/min and a tension of 30 N to form a film roll with a diameter of 130 mm.

Step (a): Step of Laminating Temporary Adhesive Material on Support or Non-Processed Surface of Substrate While the protective film was being separated from the temporary adhesive film roll for substrate processing, the composite film-shaped temporary adhesive material including the (A-1) layer, the (B-1) layer, and the (C-1) layer was unwound and laminated onto a glass plate as a support with a diameter of 200 mm (thickness: 500 μm) such that the (C-1) layer was disposed on the support. In this event, a vacuum laminator TEAM-100 (manufactured by Takatori Corporation) was used, and the degree of vacuum in the vacuum chamber was set to 80 Pa. Then, the release backing was removed.

Step (b): Step of Preheating the Support and the Substrate Before Bonding is Started A silicon wafer was used as a substrate which had a diameter of 200 mm (thickness: 725 μm) and a surface whose entire area was formed with copper posts each having a height of 40 μm and a diameter of 40 μm. The support and the substrate were preheated at temperatures shown in Table 1 in a vacuum bonding apparatus (EVG520IS) such that the surface with the copper posts of the substrate faced the surface with the temporary adhesive material layers of the support prepared in the step (a).

Step (c): Step of Bonding the Support and the Substrate Via the Temporary Adhesive Material The bonding between the substrate and the support disposed in the step (b) was started at a pressure in the chamber of $10^{-3}$ mbar or less with loading of 5 kN. The laminate was then heated at the temperature shown in Table 1 for the time shown in Table 1, stuck, and bonded. Subsequently, the laminate was heated at 180° C. for 1 hour using an oven to cure the (B-1) layer and the (C-1) layer. Thus, a sample was produced.

Examples 2 to 5 and Comparative Examples 1 to 4

The same treatment as in Example 1 was performed under the conditions shown in Table 1 to produce samples. Note that, in the row of the temporary adhesive material in Table 1, for example, "A-1/B-1/C-1" means that the temporary adhesive material comprises the (A-1) layer, the (B-1) layer and the (C-1) layer, and that the (C-1) layer is disposed on the support.

Incidentally, these examples employed a glass plate as a support for the purpose of visually observing abnormalities after bonding the substrate, but a silicon substrate such as a wafer, which does not transmit light, can also be used instead.

Then, the bonded substrate (sample) was subjected to the following tests. The results of Examples and Comparative Examples are shown in Table 1. Additionally, evaluations were carried out in the order described below. However, the evaluations were stopped when the result was judged as "poor" after the back surface grinding resistance test.

—Adhesion Test—

The obtained laminate (sample) cured by heating at 180° C. for 1 hour using the oven as described above was cooled to room temperature. Then, the adhesion state of the interface was visually observed. When no abnormality like bubbles was found at the interface, the laminate was evaluated as good, and expressed as "good". When an abnormality was found, the laminate was evaluated as poor, and expressed as "poor".

—Back Surface Grinding Resistance Test—

The obtained laminate (sample) cured by heating at 180° C. for 1 hour using the oven as described above was subjected to grinding of the back surface of the silicon wafer with a grinder (DAG810, manufactured by DISCO Co., Ltd.) using a diamond grinding wheel. After the wafer was ground to a final substrate thickness of 50 μm, abnormities such as crack and separation were checked with an optical microscope (100-folds). When no abnormity was found, the result was expressed as "good", and when an abnormity was found, the result was expressed as "poor".

—CVD Resistance Test—

The processed laminate after grinding the back surface of the silicon wafer was introduced into a CVD apparatus, subjected to an experiment to form a $SiO_2$ film with the thickness of 2 μm, and abnormities were visually checked. When no abnormality was found, the result was expressed as "good". When any of a void, scab on the wafer, breakage of the wafer, etc. was found, the result was expressed as "poor". The conditions of the CVD resistance test were as follows:

apparatus: plasma CVD PD270STL (manufactured by Samco Inc.)

RF: 500 W, internal pressure: 40 Pa

TEOS (tetraethyl orthosilicate): $O_2$=20 sccm:680 sccm.

—Separation Test—

Separation ability of the substrate was evaluated in the following manner. First, using a dicing frame, a dicing tape was stuck to the wafer side of the processed wafer after finishing the CVD resistance test, in which the wafer had been thinned to 50 μm. This dicing tape surface was set to a suction plate by vacuum suction. Then, one point of the glass was lifted by tweezers at room temperature to separate the glass substrate. When the glass substrate was separated without cracking the 50-μm wafer, the result was expressed as "good". When an abnormality such as cracking occurred, the result was evaluated as poor, and expressed as "poor".

—Cleaning Removability Test—

After the separation test, the 200-mm wafer (having been subjected to the CVD resistance test conditions) mounted on the dicing frame via the dicing tape was set on a spin coater. Isononane was then sprayed as a cleaning solvent for 3 minutes, and the wafer was rinsed by spraying isopropyl alcohol (IPA) while the wafer was rotated. Thereafter, appearance of the wafer was observed, and residue of the adhesive material resin was visually checked. When no resin remained, the laminate was evaluated as good, and expressed as "good". When the resin remained, the laminate was evaluated as poor, and expressed as "poor".

—Contact Angle Test—

After the cleaning removability test, the contact angle of the wafer with water was measured using the following apparatus. Table 1 shows an average value of the contact angles measured five times.

Measurement apparatus: contact angle meter DM-301 manufactured by Kyowa Interface Science Co., Ltd.

—Melt Viscosity Measurement—

Using a rheometer (HAAKE MARS II (manufactured by EKO INSTRUMENTS CO., LTD.)), the melt viscosity was measured under conditions of gap: 500 μm, sample diameter: 8 mm, rate of temperature rise: 10° C./min, frequency: 1 Hz, and temperature ranging from 25° C. to 200° C. Table 1 shows the melt viscosity ratio α/β of the layers.

TABLE 1

|  | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|
| Temporary adhesive material | A-1/B-1/C-1 | A-1/B-2/C-2 | A-2/B-1/C-2 | A-2/B-2/C-1 | A-1/B-1/C-1 | A-1/B-1/C-1 | A-1/B-1/C-1 | A-1/B-1/C-1 | A-2/B-1/C-1 |
| Substrate-heating temperature | 150° C. | 120° C. | 150° C. | 200° C. | 125° C. | 70° C. | 150° C. | No heating | 180° C. |
| Support-heating temperature | 100° C. | 100° C. | 70° C. | 150° C. | 110° C. | 70° C. | No heating | 100° C. | 180° C. |
| Adhesion time | 1 min | 1 min | 1 min | 1 min | 1 min | 5 min | 5 min | 5 min | 1 min |
| Adhesion | good | good | good | good | good | poor | poor | poor | good |
| Back surface grinding resistance | good | good | good | good | good | poor | poor | poor | good |
| CVD resistance | good | good | good | good | good | — | — | — | good |
| Separation | good | good | good | good | good | — | — | — | good |
| Cleaning removability | good | good | good | good | good | — | — | — | poor |
| Contact angle | <10° | <10° | <10° | <10° | <10° | — | — | — | 45° |
| Viscosity ratio (25° C.) | 0.2 | 0.1 | 0.2 | 0.2 | 0.2 | 0.2 | 0.2 | 0.2 | 0.2 |
| Viscosity ratio (lowest) | 300 | 150 | 400 | 200 | 300 | 300 | 300 | 300 | 400 |

Viscosity ratio (25° C.): melt viscosity ratio at 25° C.

Viscosity ratio (lowest): lowest melt viscosity ratio from 100° C. to 200° C. both inclusive As shown in Table 1, it was found that the heating conditions before the bonding which meet the requirements of the present invention make temporary adhesion and also separation between the support and the substrate easier, and result in particularly excellent cleaning removability (Examples 1 to 5). On the other hand, Comparative Examples 1 to 4 whose heating conditions before the bonding did not meet the requirements of the present invention had problems with adhesion or cleaning removability.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for manufacturing a laminate including a support and a substrate having a back surface to be processed and a non-processed surface, the support and the non-processed surface being bonded via a temporary adhesive material, the method comprising the steps of:
   (a) laminating the temporary adhesive material on either or both of the support and the non-processed surface of the substrate, the temporary adhesive material being formed as a film;
   (b) preheating the support and the substrate before the bonding is started; and
   (c) bonding the support and the substrate via the temporary adhesive material,
   wherein in the step (b), the substrate is heated to a temperature of 50° C. or more and 250° C. or less, while the support is heated to a temperature of 50° C. or more and 250° C. or less but different from that of the substrate, and
   in the step (c), the bonding is started with the temperatures of the support and the substrate after the preheating being different.

2. The method for manufacturing a laminate according to claim 1, wherein, in the step (c), the bonding is started with the temperatures of the support and the substrate being different by 10° C. or more.

3. The method for manufacturing a laminate according to claim 1, wherein the temporary adhesive material comprises at least two or more layers of:
   a first temporary adhesive material layer (A) located at the substrate side; and
   a second temporary adhesive material layer (B) located closer to the support side than the first temporary adhesive material layer (A).

4. The method for manufacturing a laminate according to claim 2, wherein the temporary adhesive material comprises at least two or more layers of:
   a first temporary adhesive material layer (A) located at the substrate side; and
   a second temporary adhesive material layer (B) located closer to the support side than the first temporary adhesive material layer (A).

5. The method for manufacturing a laminate according to claim 3, wherein the temporary adhesive material comprises the first temporary adhesive material layer (A) and the second temporary adhesive material layer (B) which have a melt viscosity ratio α/β of 10 or less at 25° C. and a lowest melt viscosity ratio of 100 or more at 100° C. or more and 200° C. or less.

6. The method for manufacturing a laminate according to claim 4, wherein the temporary adhesive material comprises the first temporary adhesive material layer (A) and the second temporary adhesive material layer (B) which have a melt viscosity ratio α/β of 10 or less at 25° C. and a lowest melt viscosity ratio of 100 or more at 100° C. or more and 200° C. or less.

7. The method for manufacturing a laminate according to claim 3, wherein in the step (a), the temporary adhesive material is laminated such that the first temporary adhesive material layer (A) and the second temporary adhesive material layer (B) are formed adjacent to each other.

8. The method for manufacturing a laminate according to claim 4, wherein in the step (a), the temporary adhesive material is laminated such that the first temporary adhesive material layer (A) and the second temporary adhesive material layer (B) are formed adjacent to each other.

9. The method for manufacturing a laminate according to claim 5, wherein in the step (a), the temporary adhesive material is laminated such that the first temporary adhesive material layer (A) and the second temporary adhesive material layer (B) are formed adjacent to each other.

10. The method for manufacturing a laminate according to claim 6, wherein in the step (a), the temporary adhesive material is laminated such that the first temporary adhesive material layer (A) and the second temporary adhesive material layer (B) are formed adjacent to each other.

11. The method for manufacturing a laminate according to claim 3, wherein the temporary adhesive material comprises the second temporary adhesive material layer (B) composed of a thermosetting resin, and
   a cured film of the thermosetting resin exhibits an elastic modulus of 50 MPa or more and 1 GPa or less at 25° C. measured by dynamic viscoelasticity measurement.

12. The method for manufacturing a laminate according to claim 5, wherein the temporary adhesive material comprises the second temporary adhesive material layer (B) composed of a thermosetting resin, and
   a cured film of the thermosetting resin exhibits an elastic modulus of 50 MPa or more and 1 GPa or less at 25° C. measured by dynamic viscoelasticity measurement.

13. The method for manufacturing a laminate according to claim 7, wherein the temporary adhesive material comprises the second temporary adhesive material layer (B) composed of a thermosetting resin, and
   a cured film of the thermosetting resin exhibits an elastic modulus of 50 MPa or more and 1 GPa or less at 25° C. measured by dynamic viscoelasticity measurement.

14. The method for manufacturing a laminate according to claim 3, wherein the second temporary adhesive material layer (B) is formed from a thermosetting resin composition containing:
   100 parts by mass of a siloxane bond-containing polymer having a repeating unit shown by the following general formula (1) and a weight-average molecular weight of 3,000 to 500,000; and
   0.1 to 50 parts by mass of one or more crosslinkers selected from an amino condensate, a melamine resin, and a urea resin each modified with formalin or formalin-alcohol, a phenol compound having on average two or more methylol groups or alkoxy methylol groups per molecule, and an epoxy compound having on average two or more epoxy groups per molecule, wherein $R^1$ to $R^4$ may be identical or different and each represent a monovalent hydrocarbon group having 1 to 8 carbon atoms; "m" is an integer of 1 to 100; B is a positive number, and A is 0 or a positive number, provided that A+B=1; X represents a divalent organic group shown by the following general formula (2):

(2)

wherein Z represents a divalent organic group selected from any of

N is 0 or 1; $R^5$ and $R^6$ each represent an alkyl group or an alkoxy group having 1 to 4 carbon atoms and may be the same or different from each other; and "k" is any of 0, 1, and 2.

15. The method for manufacturing a laminate according to claim 3, wherein the second temporary adhesive material layer (B) is formed from a thermosetting resin composition containing:

100 parts by mass of a siloxane bond-containing polymer having a repeating unit shown by the following general formula (3) and a weight-average molecular weight of 3,000 to 500,000; and

0.1 to 50 parts by mass of one or more crosslinkers selected from a phenol compound having on average two or more phenol groups per molecule and an epoxy compound having on average two or more epoxy groups per molecule, (3)

wherein $R^7$ to $R^{10}$ may be identical or different and each represent a monovalent hydrocarbon group having 1 to 8 carbon atoms; "n" is an integer of 1 to 100; D is a positive number, and C is 0 or a positive number, provided that C+D=1; Y represents a divalent organic group shown by the following general formula (4):

(4)

wherein V represents a divalent organic group selected from any of

"p" represents 0 or 1; $R^{11}$ and $R^{12}$ each represent an alkyl group or an alkoxy group having 1 to 4 carbon atoms and may be the same or different from each other; and "h" is any of 0, 1, and 2.

16. The method for manufacturing a laminate according to claim 14, wherein the second temporary adhesive material layer (B) is formed from a thermosetting resin composition containing:

100 parts by mass of a siloxane bond-containing polymer having a repeating unit shown by the following general formula (3) and a weight-average molecular weight of 3,000 to 500,000; and

0.1 to 50 parts by mass of one or more crosslinkers selected from a phenol compound having on average two or more phenol groups per molecule and an epoxy compound having on average two or more epoxy groups per molecule, (3)

wherein $R^7$ to $R^{10}$ may be identical or different and each represent a monovalent hydrocarbon group having 1 to 8 carbon atoms; "n" is an integer of 1 to 100; D is a positive number, and C is 0 or a positive number, provided that C+D=1; Y represents a divalent organic group shown by the following general formula (4):

(4)

wherein V represents a divalent organic group selected from any of

"p" represents 0 or 1; $R^{11}$ and $R^{12}$ each represent an alkyl group or an alkoxy group having 1 to 4 carbon atoms and may be the same or different from each other; and "h" is any of 0, 1, and 2.

17. A method for manufacturing a substrate, comprising the steps of:
   (d) after a laminate is obtained by the method for manufacturing a laminate according to claim 1, processing the back surface of the substrate; and
   thereafter, (e) removing the support and the temporary adhesive material from the laminate, and then cleaning the substrate, wherein
   in the step (e), the surface of the cleaned substrate where the support has been removed has a contact angle of less than 30° with water.

18. The method for manufacturing a laminate according to claim 1, wherein both the step (b) and the step (c) are performed in a bonding apparatus in which a heater is incorporated.

* * * * *